United States Patent
Park et al.

(10) Patent No.: US 8,929,171 B2
(45) Date of Patent: Jan. 6, 2015

(54) VOLTAGE SUPPLY CONTROLLER, NONVOLATILE MEMORY DEVICE AND MEMORY SYSTEM

(75) Inventors: June-Hong Park, Seongnam-Si (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 214 days.

(21) Appl. No.: 13/571,486

(22) Filed: Aug. 10, 2012

(65) Prior Publication Data

US 2013/0114338 A1    May 9, 2013

(30) Foreign Application Priority Data

Nov. 9, 2011    (KR) .................. 10-2011-0116376

(51) Int. Cl.
| | | |
|---|---|---|
| G11C 11/4193 | (2006.01) | |
| G11C 5/14 | (2006.01) | |
| G11C 16/04 | (2006.01) | |
| G11C 16/30 | (2006.01) | |
| G11C 8/10 | (2006.01) | |

(52) U.S. Cl.
CPC ............. G11C 5/145 (2013.01); G11C 16/04 (2013.01); G11C 16/30 (2013.01); G11C 8/10 (2013.01); G11C 5/147 (2013.01)
USPC .................. 365/228; 365/185.02; 365/185.18

(58) Field of Classification Search
USPC ................................ 365/228, 185.02, 185.18
See application file for complete search history.

(56) References Cited

U.S. PATENT DOCUMENTS

| | | |
|---|---|---|
| 5,757,213 A | 5/1998 | Moller |
| 6,166,961 A | 12/2000 | Lee et al. |
| 6,240,027 B1 | 5/2001 | Lee et al. |
| 7,092,292 B2 | 8/2006 | Mokhlesi et al. |
| 2003/0090940 A1 | 5/2003 | Lambrache et al. |
| 2004/0017690 A1 | 1/2004 | Lee et al. |
| 2004/0037150 A1 | 2/2004 | Park et al. |
| 2005/0184788 A1 | 8/2005 | Johansson et al. |
| 2005/0219903 A1 | 10/2005 | Daga |
| 2006/0268625 A1* | 11/2006 | Imaizumi et al. ........ 365/189.01 |
| 2007/0047365 A1 | 3/2007 | Yoshinaga et al. |
| 2007/0216471 A1 | 9/2007 | Lu et al. |
| 2007/0297238 A1 | 12/2007 | Cho et al. |
| 2008/0068883 A1* | 3/2008 | Kang et al. ............... 365/185.03 |
| 2008/0151639 A1 | 6/2008 | Yang et al. |
| 2008/0183951 A1* | 7/2008 | Lee et al. ...................... 711/103 |
| 2009/0096506 A1* | 4/2009 | Ogiwara et al. ............. 327/530 |
| 2009/0154221 A1 | 6/2009 | Kim et al. |

FOREIGN PATENT DOCUMENTS

| | | |
|---|---|---|
| JP | 2010272156 | 12/2010 |
| KR | 1020060099925 A | 9/2006 |

* cited by examiner

*Primary Examiner* — Hoai V Ho
*Assistant Examiner* — Jay Radke
(74) *Attorney, Agent, or Firm* — Volentine & Whitt, PLLC

(57) ABSTRACT

A nonvolatile memory device includes a voltage supply controller (VSC) detecting a level of a power supply voltage and generating a first internal voltage in response thereto. The VSC provides the first internal voltage at a level equal to an external high voltage when a power supply voltage is normally supplied, but provides the first internal voltage at a level lower than the external high voltage when a power supply voltage is abnormally supplied.

19 Claims, 10 Drawing Sheets

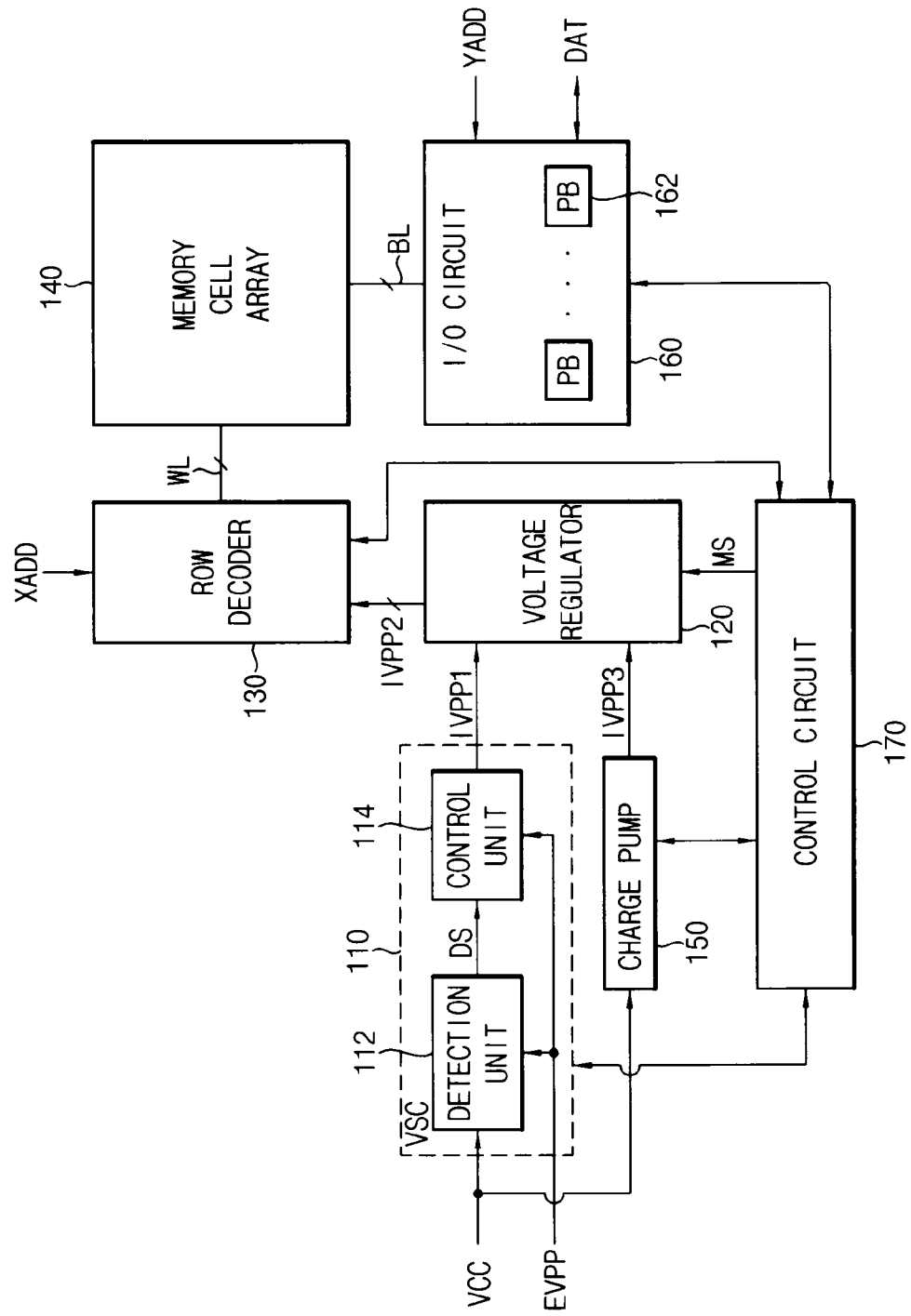

VOLTAGE SUPPLY CONTROLLER, NONVOLATILE MEMORY DEVICE AND MEMORY SYSTEM

CROSS-REFERENCE TO RELATED APPLICATION

This application claims priority under 35 USC §119 to Korean Patent Application No. 2011-0116376 filed on Nov. 9, 2011, the subject matter of which is hereby incorporated by reference.

BACKGROUND

The inventive concept relates generally to semiconductor memory devices and memory systems. More particularly, the inventive concept relates nonvolatile memory devices incorporating a voltage supply controller.

Semiconductor memory devices may be respectively categorized as nonvolatile or volatile in nature according to their ability, or lack of ability, to retain stored data in the absence of applied power. The operation (e.g., program, read and/or erase) of nonvolatile memory devices requires the timed application of various control signals to the word lines, bit lines, and/or the semiconductor bulk of the constituent memory cell array. Certain control signals are termed "high voltage". That is, certain control signals have a level higher than the level of a nominal power supply voltage applied to (or generated within) the nonvolatile memory device. For example, one or more high voltage signal(s) is typically applied to the memory cells of a memory cell array during a program operation and/or an erase operation. In this regard, some nonvolatile memory devices incorporate a high voltage generator that internally generates one or more of the required high voltage signals.

SUMMARY

In one embodiment, the inventive concept provides a nonvolatile memory device, comprising; a voltage supply controller receiving a power supply voltage and an external high voltage having a level higher than the power supply voltage and configured to generate a detection signal by detecting a level of the power supply voltage and generate a first internal voltage in response to the detection signal and the external high voltage, wherein a level of the first internal voltage varies with the detection signal, a voltage regulator receiving the first internal voltage and configured to generate second internal voltages in response to the first internal voltage, a row decoder configured to selectively provide the second internal voltages to a plurality of word lines, and a memory cell array including a plurality of nonvolatile memory cells, each nonvolatile memory cell being connected to a respective one of the plurality of word lines and a respective one of a plurality of bitlines.

In another embodiment, the inventive concept provides a memory system, comprising; a memory controller configured to control operation of a nonvolatile memory device, wherein the nonvolatile memory device comprises; a voltage supply controller receiving a power supply voltage and an external high voltage having a level higher than the power supply voltage and configured to generate a detection signal by detecting a level of the power supply voltage and generate a first internal voltage in response to the detection signal and the external high voltage, wherein a level of the first internal voltage varies with the detection signal, a voltage regulator receiving the first internal voltage and configured to generate second internal voltages in response to the first internal voltage, a row decoder configured to selectively provide the second internal voltages to a plurality of word lines, and a memory cell array including a plurality of nonvolatile memory cells, each nonvolatile memory cell being connected to a respective one of the plurality of word lines and a respective one of a plurality of bitlines.

In another embodiment, the inventive concept provides a flash memory device, comprising; a plurality of flash memory cells arranged in a memory cell array including a plurality of word lines and a plurality of bitlines, a row decoder that selectively provide at least one of a plurality control signals to each one of the plurality of word lines, wherein the plurality of control signals are respectively derived from an internal voltage, a voltage regulator receiving a first internal voltage and configured to generate the internal voltage in response to the first internal voltage, and a voltage supply controller receiving a power supply voltage and an external high voltage having an activated level higher than an activated level of the power supply voltage and configured to generate a detection signal by detecting a level of the power supply voltage and generate the first internal voltage in response to the detection signal and the external high voltage, wherein a level of the first internal voltage is equal to the activated level of the external high voltage when the power supply voltage is normally supplied, and the level of the first internal voltage is lower than the activated level of the external high voltage when the power supply voltage is abnormally supplied.

BRIEF DESCRIPTION OF THE DRAWINGS

Illustrative, non-limiting example embodiments will be more clearly understood from the following detailed description taken in conjunction with the accompanying drawings.

FIG. 1 is a block diagram illustrating a nonvolatile memory device according to an embodiment of the inventive concept.

DETAILED DESCRIPTION OF THE EMBODIMENTS

Figure 2A:
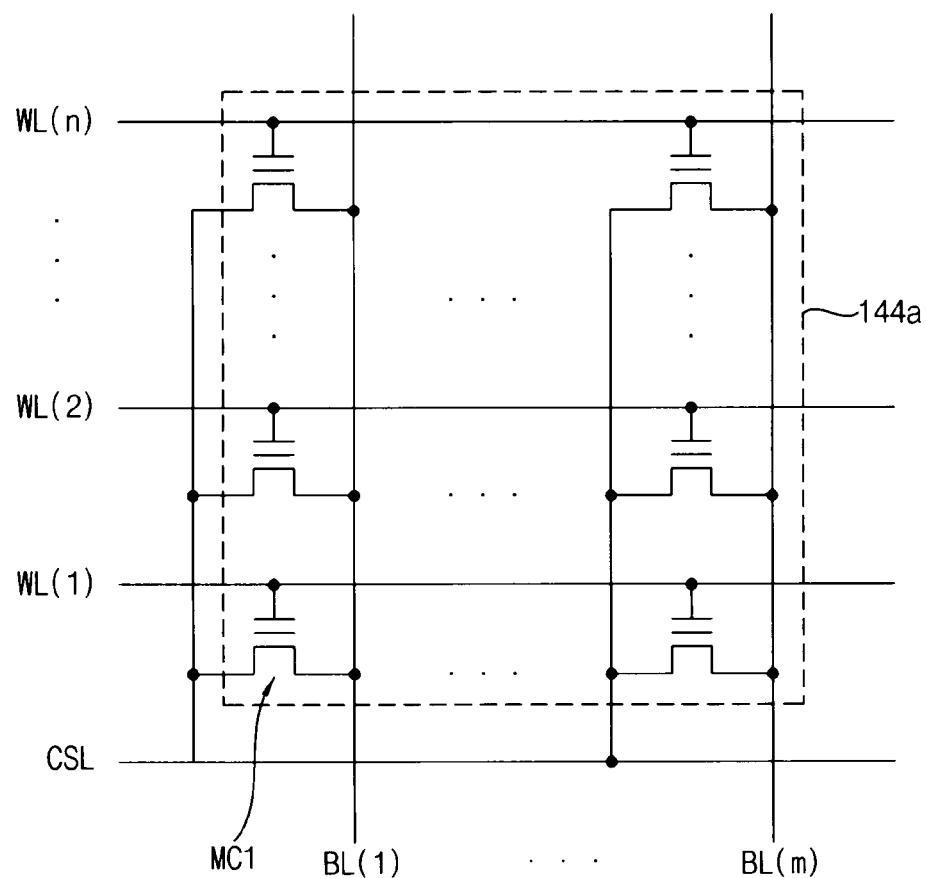
FIGS. 2A, 2B and 2C are diagrams illustrating examples of a memory cell array included in the nonvolatile memory device of FIG. 1.

Various embodiments of the inventive concept will now be described in some additional detail with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a nonvolatile memory device according to an embodiment of the inventive concept.

Referring to FIG. 1, a nonvolatile memory device 100 includes in relevant portion a voltage supply controller 110, a voltage regulator 120, a row decoder 130 and a memory cell array 140. The nonvolatile memory device 100 may further include a charge pump 150, an input/output (I/O) circuit 160 and a control circuit 170.

The nonvolatile memory device 100 of FIG. 1 may be a flash memory device, and may perform a program operation and/or an erase operation using an external high voltage EVPP, wherein the application (or activation) level of EVPP is higher than that of a power supply voltage VCC. However, despite the fact that the nonvolatile memory device 100 will hereafter be described in terms of an exemplary flash memory device, embodiments of the inventive concept may be applied to other types of nonvolatile memory, such as a phase change random access memory (PRAM), a resistance random access memory (RRAM), a magnetic random access memory (MRAM), a ferroelectric random access memory (FRAM), etc.

The voltage supply controller 110 comprises a detection unit 112 that generates a detection signal DS by detecting the level of the power supply voltage VCC, and a control unit 114 that generates a first internal voltage IVPP1 in response to the detection signal DS and the external high voltage EVPP.

The level of the first internal voltage IVPP1 may change depending on whether the power supply voltage VCC is "normally supplied" (i.e., applied at a level within a nominally defined range) to the nonvolatile memory device 100. For example, when the power supply voltage VCC is normally supplied to the nonvolatile memory device 100, the first internal voltage IVPP1 may be provided at a first voltage level that is substantially the same as a defined level for the external high voltage EVPP. However, when the power supply voltage VCC is "abnormally supplied" (i.e., applied at a level outside the nominally defined range), the first internal voltage IVPP1 may be provided at a second voltage level lower than the first voltage level.

In the illustrated embodiment of FIG. 1, the detection unit 112 generates the detection signal DS upon detecting the level of the power supply voltage VCC in relation to the external high voltage EVPP and a ground voltage. The control unit 114 receives the external high voltage EVPP and may provide the external high voltage EVPP as the first internal voltage IVPP1 in response to the detection signal DS when the power supply voltage VCC is normally supplied (or VCC has "a normal level"). However, the control unit 114 may interrupt this provision of the external high voltage EVPP as the first internal voltage IVPP1 when the detection signal DS indicates that the power supply voltage VCC is abnormally supplied (or VCC has "an abnormal level"). Alternately, the control unit 114 may reduce the level of the external high voltage EVPP being output as the first internal voltage IVPP1 in response to the detection signal DS to instead provide a reduced first internal voltage IVPP1 when the power supply voltage VCC has an abnormal level. More detailed examples of the detection unit 112 and control unit 114 will be described hereafter with reference to FIGS. 3, 4, 5, 6 and 7.

Returning to FIG. 1, the voltage regulator 120 is configured to generate one or more second internal voltages IVPP2 in response to the first internal voltage IVPP1. The second internal voltages IVPP2 may be word line voltages since they are provided to a plurality of word lines WL connected to the row decoder 130. The second internal voltages IVPP2 may include, for example, a program voltage, a verification voltage, a read voltage, an erase voltage, etc. And the respective levels of the second internal voltages IVPP2 may be higher than the level of the power supply voltage VCC. Although not shown in FIG. 1, the voltage regulator 120 may further generate bitline voltages based on the first internal voltage IVPP1. The bitline voltages may be provided to a plurality of bitlines BL by the I/O circuits 160, and may include, for example, a program permission voltage, a program inhibition voltage, a precharge voltage, etc.

The row decoder 130 selectively provides the second internal voltages IVPP2 to the word lines WL. For example, the row decoder 130 may select one of the wordlines WL based on a row address XADD and consequently, a plurality of memory cells connected to the selected wordline may be selected. During a program operation, the program voltage and verification voltage may be sequentially applied to a selected word line. During a read operation, the read voltage may be applied to a selected word line, and during an erase operation, the erase voltage may be applied to a selected word line.

The memory cell array 140 will include a plurality of nonvolatile memory cells. Each memory cell is respectively connected to a word line WL and a bitline BL. As will be described hereafter with reference to FIGS. 2A, 2B and 2C, the plurality of memory cells may include NAND flash memory cells or NOR flash memory cells, and may be arranged in a two-dimensional (2-D) array structure or a three-dimensional (3-D) vertical array structure (e.g., a vertical memory device having a stacked structure).

In certain embodiments, the plurality of memory cells may include single-level memory cells (SLCs), each capable of storing a single bit of data, and/or multi-level memory cells (MLCs), each capable of storing two or more bits of data. MLCs may be programmed using various programming schemes, such as a shadow programming scheme, a reprogramming scheme, or an on-chip buffered programming scheme.

The charge pump 150 may be configured to receive the power supply voltage VCC, and generate a third internal voltage IVPP3 using a charge pumping operation. For example, the charge pump 150 may be implemented with one of various structures, such as a Dickson's pump, a four-phase charge pump, a floating-well charge pump (FWCP), etc. If the nonvolatile memory device 100 includes the charge pump 150, the voltage regulator 120 may select one of the first internal voltage IVPP1 and the third internal voltage IVPP3 based on a mode selection signal MS, and may generate the plurality of second internal voltages IVPP2 based on the selected internal voltage. The mode selection signal MS may be generated by the control circuit 170.

The I/O circuit 160 may be connected to the plurality of bitlines BL, and may store data to be written in the memory cell array 140 or data read out from the memory cell array 140. The I/O circuit 160 may include a plurality of page buffers 162 each of which is disposed corresponding to a respective one of the bitlines BL and includes a plurality of data latches. The I/O circuit 160 may operate as a sense amplifier or a write driver depending on the operation modes. For example, the I/O circuit 160 may operate as the sense amplifier during the read mode, and may operate as the write driver during the program mode. The I/O circuit 160 may further provide a function of a column decoder that selects the bitlines BL based on a column address YADD, or a function of a pass-fail detector that verifies threshold voltages in the case where the nonvolatile memory device 100 employs an incremental step pulse method.

The I/O circuit 160 may perform the program operation, the read operation and the erase operation in response to a control signal provided from the control circuit 170. In the program mode, the I/O circuit 160 may load data provided from an external device and may apply the program permission voltage or the program inhibition voltage to each of bitlines BL based on the write data. As such, target memory cells which are currently to be programmed may correspond to the memory cells that are coupled to the selected wordline and the bitlines to which the program permission voltage is applied. The verification operation may be performed after programming the target memory cells to determine whether the target memory cells are successfully programmed. Such program and verification operations may be repeated until a target state is completely programmed. In the read mode, the I/O circuit 160 may output read data by detecting voltages of the bitlines BL. Operations of the I/O circuit 160 in the erase mode may be similar to the operations of the I/O circuit 160 in the program mode.

The control circuit 170 may control overall operation of the nonvolatile memory device 100, and may control operations of the voltage supply controller 110, the voltage regulator 120, the row decoder 130 and the I/O circuit 160.

Although not illustrated in FIG. 1, the circuitry implementing the voltage regulator 120, the row decoder 130, the memory cell array 140, the I/O circuit 160 and/or the control circuit 170 may be respectively powered by application of the power supply voltage VCC.

As will be appreciated, many nonvolatile memory devices require one or more high voltage control signals, each having an applied level higher than the power supply voltage VCC. These high voltage control signals are used, for example, during the program and/or erase operation(s). In certain nonvolatile memory devices, one or more high voltage generator(s) (e.g., one or more charge pumps) may be used to generate the high voltage control signals using an external high voltage.

However, such nonvolatile memory devices using the external high voltage may continue to supply the external high voltage to internal circuitry when the power supply voltage VCC is interrupted. As a result, the operational characteristics of such nonvolatile memory devices may be degraded over time as constituent elements are damaged, and/or leakage current increases due to the continued application of the external high voltage.

In contrast, the nonvolatile memory device 100 of FIG. 1 according to an embodiment of the inventive concept, includes the voltage supply controller 110 that generates the first internal voltage IVPP1 based on the detection signal DS and the external high voltage EVPP. The first internal voltage IVPP1 provided by the voltage supply controller 110 changes level in accordance with whether or not the power supply voltage VCC is normally supplied to the nonvolatile memory device 100. When the power supply voltage VCC is normally supplied, the voltage supply controller 110 may output the external high voltage EVPP as the first internal voltage IVPP1. When the power supply voltage VCC is not supplied or abnormally supplied, the voltage supply controller 110 may interrupt the output of the external high voltage EVPP, or may reduce the level of the external high voltage EVPP and output the reduced external high voltage as the first internal voltage IVPP1. Accordingly, the nonvolatile memory device 100 may effectively and stably perform program and/or erase operations using the external high voltage EVPP while providing relatively improved performance and relatively reduced current consumption.

Figure 2B:
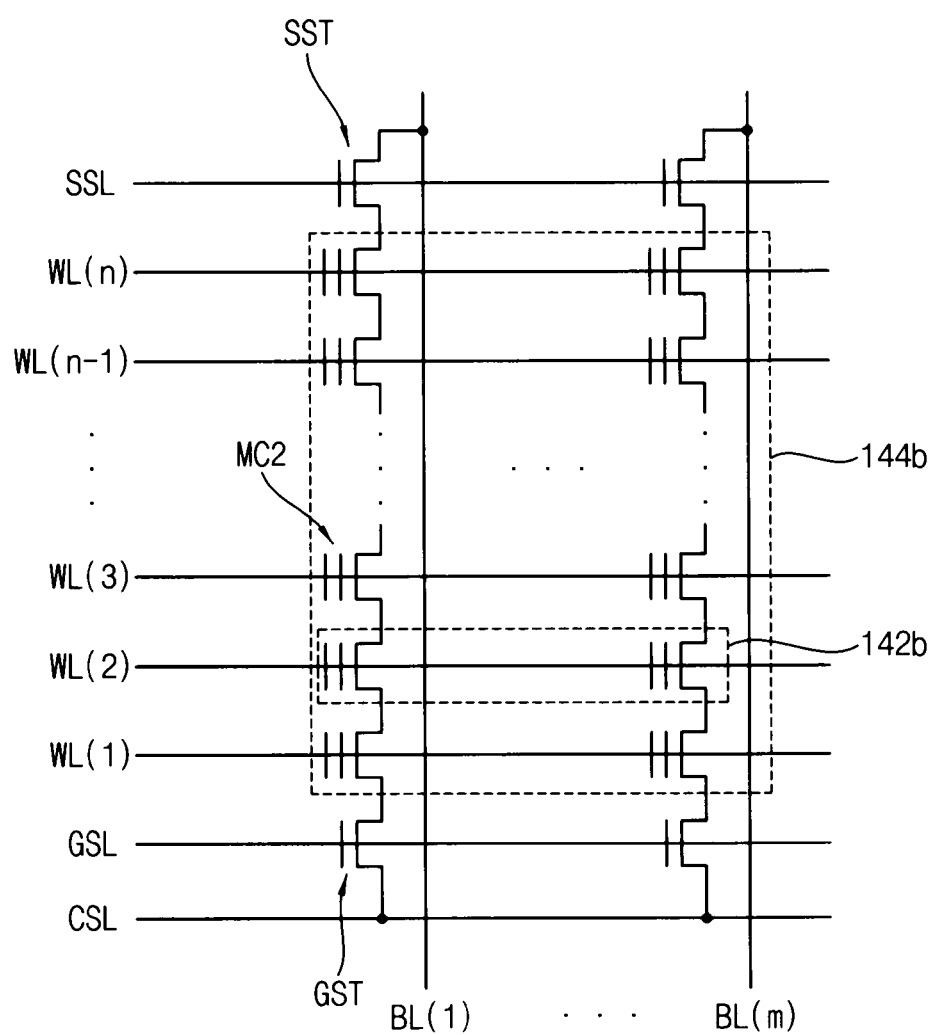
Figure 2C:
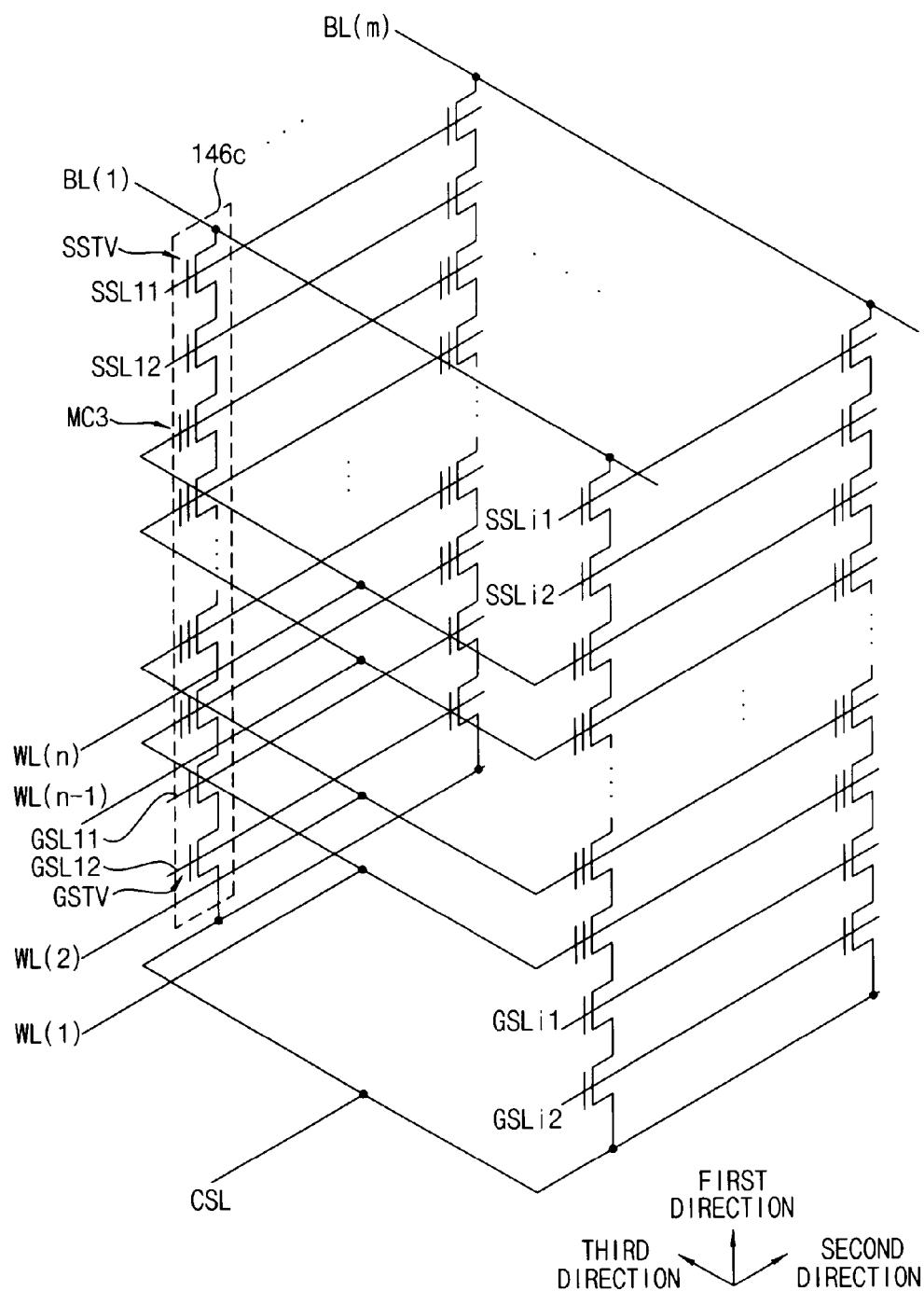

FIGS. 2A, 2B and 2C are diagrams illustrating, in part, examples of a memory cell array included in the nonvolatile memory device of FIG. 1.

FIG. 2A is a circuit diagram illustrating a memory cell array included in a NOR flash memory device. FIG. 2B is a circuit diagram illustrating a memory cell array included in a NAND flash memory device. FIG. 2C is a circuit diagram illustrating a memory cell array included in a vertical flash memory device.

Referring to FIG. 2A, a memory cell array 140a may include a plurality of memory cells MC1. Memory cells in the same column may be connected in parallel between one of bitlines BL(1), . . . , BL(m) and a common source line CSL. Memory cells in the same row may be commonly connected to the same wordline among wordlines WL(1), WL(2), . . . , WL(n). For example, memory cells in a first column may be connected in parallel between a first bitline BL(1) and the common source line CSL. Memory cells in a first row may be commonly connected to a first wordline WL(1). The memory cells MC1 may be controlled by a voltage on the wordlines WL(1), ..., WL(n). In the NOR flash memory device including the memory cell array 140a, a read operation and a program operation may be performed per byte or word, and an erase operation may be performed per block 144a.

Referring to FIG. 2B, the memory cell array 140b may include string select transistors SST, ground select transistors GST and a plurality of memory cells MC2. The string select transistors SST may be connected to bitlines BL(1), ..., BL(m), and the ground select transistors GST may be connected to a common source line CSL. The memory cells MC2 may be connected in series between the string select transistors SST and the ground select transistors GST. Memory cells in the same row may be connected to the same wordline among wordlines WL(1), WL(2), WL(3), ..., WL(n-1), WL(n). For example, 16, 32 or 64 wordlines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the wordlines WL(1), ..., WL(n).

In the NAND flash memory device including the memory cell array 140b, a read operation and a program operation may be performed per page 142b, and an erase operation may be performed per block 144b. According to example embodiments, each page buffer 162 of FIG. 1 may be connected to an odd-numbered bitline and an even-numbered bitline. In this case, the odd-numbered bitlines may form odd-numbered pages, the even-numbered bitlines may form even-numbered pages, and program operations for the odd-numbered pages and the even-numbered pages may be alternately performed.

Referring to FIG. 2C, a memory cell array 140c may include a plurality of strings 146c each of which has a vertical structure. The plurality of strings 146c may be formed in a second direction to define a string column, and a plurality of string columns may be formed in a third direction to define a string array. Each string may include string select transistors SSTV, ground select transistors GSTV, and a plurality of memory cells MC3 that are formed in a first direction and are connected in series between the string select transistors SSTV and the ground select transistors GSTV.

The string select transistors SSTV may be connected to bitlines BL(1), ..., BL(m), and the ground select transistors GSTV may be connected to a common source line CSL. The string select transistors SSTV may be connected to string select lines SSL11, SSL12, ..., SSLi1, SSLi2, and the ground select transistors GSTV may be connected to ground select lines GSL11, GSL12, ..., GSLi1, GSLi2. The memory cells in the same layer may be connected to the same wordline among wordlines WL(1), WL(2), ... WL(n-1), WL(n). Each string select line and each ground select line may extend in the second direction, and the string select lines SSL11, ..., SSLi2 and the ground select lines GSL11, ..., GSLi2 may be formed in the third direction. Each wordline may extend in the second direction, and the wordlines WL(1), ..., WL(n) may be formed in the first direction and the third direction. Each bitline may extend in the third direction, and the bitlines BL(1), ..., BL(m) may be formed in the second direction. The memory cells MC3 may be controlled by a voltage on the wordlines WL(1), ..., WL(n).

Similarly to the NAND flash memory device, in the vertical flash memory device including the memory cell array 140c, a read operation and a program operation may be performed per page, and an erase operation may be performed per block.

Although not illustrated in FIG. 2C, according to example embodiments, two string select transistors included in a single string may be connected to a single string select line, and two ground select transistors included in the single string may be connected to a single ground select line. According to example embodiments, the single string may include one string select transistor and one ground select transistor.

Figure 3:
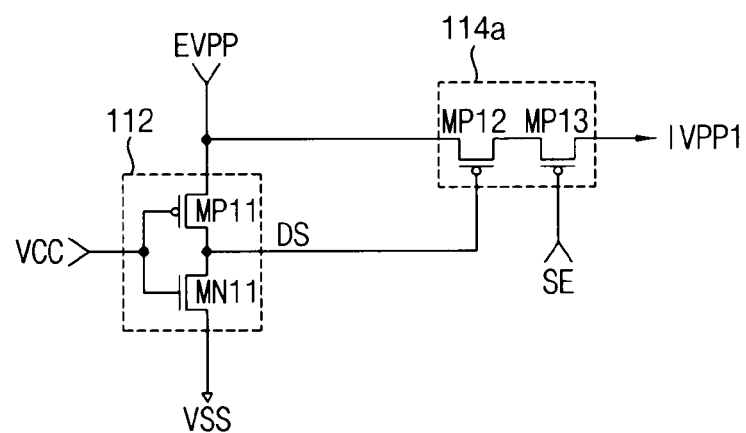
FIG. 3 is a circuit diagram illustrating an example of a voltage supply controller included in the nonvolatile memory device of FIG. 1.

FIG. 3 is a circuit diagram illustrating one example of a voltage supply controller included in the nonvolatile memory device of FIG. 1.

Referring to FIG. 3, a voltage supply controller 110a comprises a detection unit 112 and a control unit 114a.

The detection unit 112 may generate the detection signal DS by detecting the level of the power supply voltage VCC based on the external high voltage EVPP and a ground voltage VSS. The detection unit 112 may include a first p-type metal oxide semiconductor (PMOS) transistor MP11 and a first n-type metal oxide semiconductor (NMOS) transistor MN11.

The first PMOS transistor MP11 may have a first electrode (e.g., a source electrode) receiving the external high voltage EVPP, a control electrode (e.g., a gate electrode) receiving the power supply voltage VCC, and a second electrode (e.g., a drain electrode) outputting the detection signal DS. The first NMOS transistor MN11 may have a first electrode (e.g., a drain electrode) connected to the second electrode of the first PMOS transistor MP11, a control electrode (e.g., a gate electrode) receiving the power supply voltage VCC, and a second electrode (e.g., a source electrode) receiving the ground voltage VSS.

The control unit 114a may output the external high voltage EVPP as the first internal voltage IVPP1 in response to the detection signal DS when the power supply voltage VCC has the normal level. The control unit 114a may interrupt the output of the external high voltage EVPP in response to the detection signal DS when the power supply voltage VCC has the abnormal level. The control unit 114a may include a second PMOS transistor MP12 and a third PMOS transistor MP13.

The second PMOS transistor MP12 may have a first electrode (e.g., a source electrode) receiving the external high voltage EVPP, a control electrode (e.g., a gate electrode) receiving the detection signal DS, and a second electrode (e.g., a drain electrode). The third PMOS transistor MP13 may have a first electrode (e.g., a source electrode) connected to the second electrode of the second PMOS transistor MP12, a control electrode (e.g., a gate electrode) receiving a switch enable signal SE, and a second electrode (e.g., a drain electrode) outputting the first internal voltage IVPP1. The switch enable signal SE may be generated by the control circuit 170 in FIG. 1.

Figure 4:
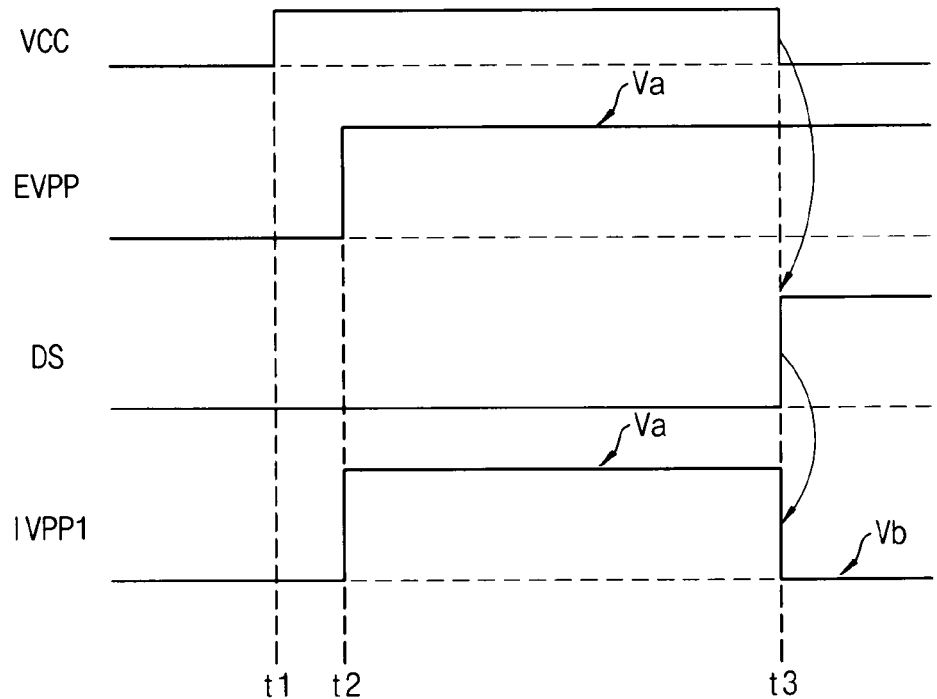
FIG. 4 is a timing diagram for describing an operation of the voltage supply controller of FIG. 3.

FIG. 4 is a related timing diagram further describing the operation of the voltage supply controller of FIG. 3.

Referring to FIGS. 3 and 4, at time t1, the power supply voltage VCC is supplied. In other words, the power supply voltage VCC is activated and has the normal level (e.g., about 3.3V). When the power supply voltage VCC has a normal level, the first PMOS transistor MP11 is turned OFF, and the first NMOS transistor MN11 is turned ON. The detection signal DS is logically "low" (e.g., about 0V), and the second PMOS transistor MP12 is turned ON. Assuming that the switch enable signal SE is also low, the third PMOS transistor MP13 is turned ON during the entire operation. Under these conditions, the level of the first internal voltage IVPP1 is substantially ground voltage VSS since the external high voltage EVPP is not yet supplied.

At time t2, the external high voltage EVPP is supplied after a predetermined delay from time t1. In other words, the external high voltage EVPP is activated at time t2 and has a defined first voltage level Va (e.g., about 10V or about 20V). At this time, the detection signal DS remains low, and the second PMOS transistor MP12 remains turned ON since the power supply voltage VCC is normally supplied. Under these conditions, the control unit 114a outputs the external high voltage EVPP as the first internal voltage IVPP1, and the first internal voltage IVPP1 has the first voltage level Va.

However, at time t3, the power supply voltage VCC is shut off. That is, the power supply voltage VCC is deactivated due to (e.g.,) a power fluctuation or the blackout and the level of the power supply voltage VCC falls to an abnormal level (e.g., about 0V in the illustrated example). When the power supply voltage VCC has an abnormal level, the first PMOS transistor MP11 is turned ON, and the first NMOS transistor MN11 is turned OFF. The detection signal DS transitions from low to logically "high" (e.g., the first voltage level Va), and the second PMOS transistor MP12 is turned OFF. The output of the external high voltage EVPP is blocked by the second PMOS transistor MP12. In other words, the first internal voltage IVPP1 has a second voltage level Vb (e.g., about ground voltage VSS).

In this manner, the voltage supply controller 110a of FIG. 3 prevents damage to transistors included in the nonvolatile memory device 100, may reduce the current consumption for the nonvolatile memory device 100, and may improve a performance of the nonvolatile memory device 100 by interrupting the output of the external high voltage EVPP when the power supply voltage VCC is abnormally supplied.

Figure 5:
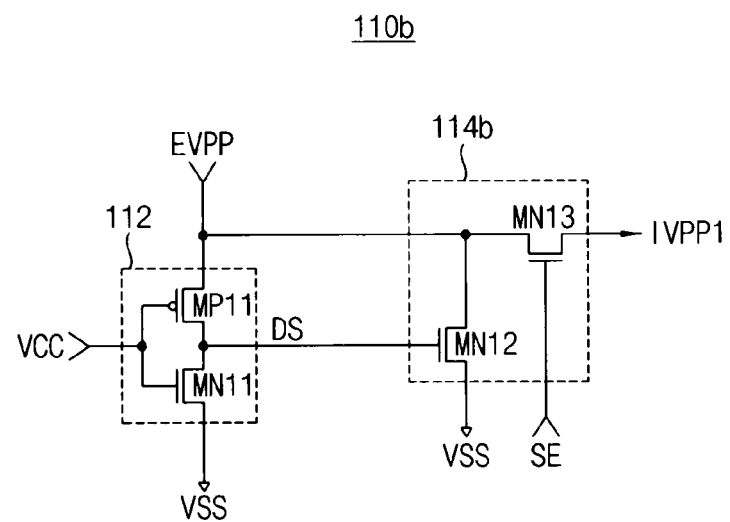
FIG. 5 is a circuit diagram illustrating another example of the voltage supply controller included in the nonvolatile memory device of FIG. 1.

FIG. 5 is a circuit diagram illustrating in another example the voltage supply controller included in the nonvolatile memory device of FIG. 1.

Referring to FIG. 5, a voltage supply controller 110b again comprises a detection unit 112 and a control unit 114b. The detection unit 112 in FIG. 5 may be substantially the same as the detection unit 112 in FIG. 3.

The control unit 114b may output the external high voltage EVPP as the first internal voltage IVPP1 in response to the detection signal DS when the power supply voltage VCC has the normal level. The control unit 114b may reduce the level of the external high voltage EVPP and may output the reduced external high voltage as the first internal voltage IVPP1 in response to the detection signal DS when the power supply voltage VCC has the abnormal level. The control unit 114b may include a second NMOS transistor MN12 and a third NMOS transistor MN13.

The second NMOS transistor MN12 may have a first electrode (e.g., a drain electrode) receiving the external high voltage EVPP, a control electrode (e.g., a gate electrode) receiving the detection signal DS, and a second electrode (e.g., a source electrode) receiving the ground voltage VSS. The third NMOS transistor MN13 may have a first electrode (e.g., a drain electrode) connected to the first electrode of the second NMOS transistor MN12, a control electrode (e.g., a gate electrode) receiving the switch enable signal SE, and a second electrode (e.g., a source electrode) outputting the first internal voltage IVPP1. The switch enable signal SE may be generated by the control circuit 170 in FIG. 1.

Figure 6:
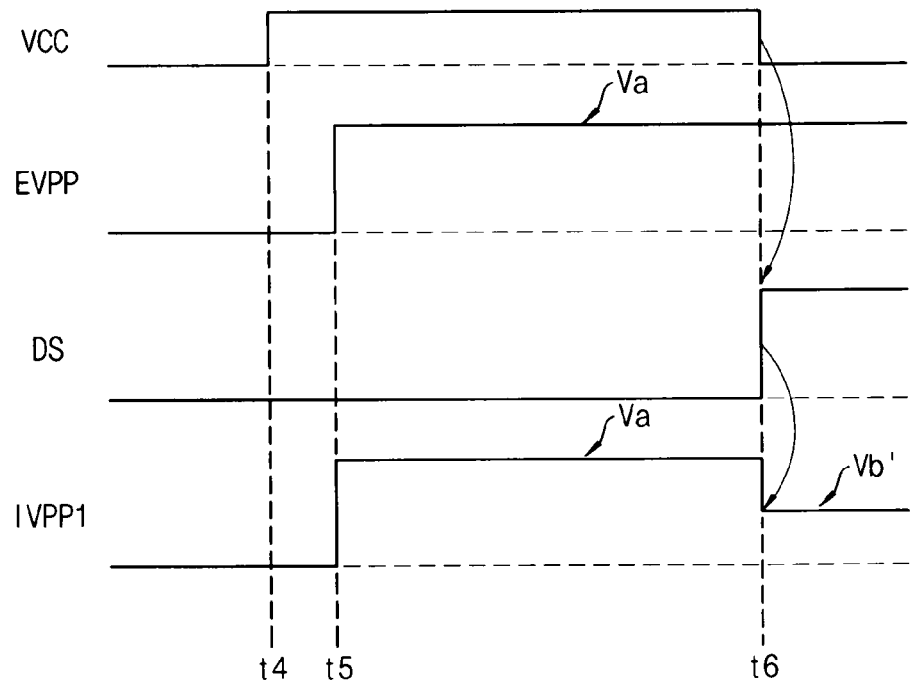
FIG. 6 is a timing diagram for describing an operation of the voltage supply controller of FIG. 5.

FIG. 6 is a related timing diagram further describing the operation of the voltage supply controller of FIG. 5.

Referring to FIGS. 5 and 6, at time t4, the power supply voltage VCC is normally supplied. The first PMOS transistor MP11 is turned OFF, the first NMOS transistor MN11 is turned ON, the detection signal DS is low, and the second NMOS transistor MN12 is turned OFF. Assuming that the switch enable signal SE is high, the third NMOS transistor MN13 is turned ON during an entire operation. Under these conditions, the level of the first internal voltage IVPP1 is substantially the same as ground voltage VSS since the external high voltage EVPP is not yet supplied.

At time t5, the external high voltage EVPP is supplied after a predetermined delay following time t4. That is, the external high voltage EVPP is activated and has a first voltage level Va. The detection signal DS remains low, and the second NMOS transistor MN12 is still turned OFF. Under these conditions, the control unit 114b outputs the external high voltage EVPP as the first internal voltage IVPP1. In other words, the first internal voltage IVPP1 has the first voltage level Va.

At time t6, the power supply voltage VCC is shut off. That is, the power supply voltage VCC is deactivated or exhibits an abnormal level. The first PMOS transistor MP11 is turned ON, the first NMOS transistor MN11 is turned OFF, the detection signal DS transitions from low to high, and the second NMOS transistor MN12 is turned ON. The external high voltage EVPP is partially discharged to the ground voltage VSS through the second NMOS transistor MN12, and the level of the external high voltage EVPP is reduced. The control unit 114b outputs the reduced external high voltage as the first internal voltage IVPP1. In other words, the first internal voltage IVPP1 has a level of the reduced external high voltage (e.g., a second voltage level Vb'). The second voltage level Vb' may be lower than the first voltage level Va but may be higher than ground voltage VSS. The second voltage level Vb' may be determined based on the discharged level of the external high voltage EVPP, and the discharged level of the external high voltage EVPP may be determined based on the size of the second NMOS transistor MN12.

The voltage supply controller 110b of FIG. 5 may prevent damage to the transistors included in the nonvolatile memory device 100, may reduce the current consumption of the nonvolatile memory device 100, and may improve a performance of the nonvolatile memory device 100 by outputting the reduced external high voltage as the first internal voltage IVPP1 when the power supply voltage VCC is not supplied or abnormally supplied.

Figure 7:
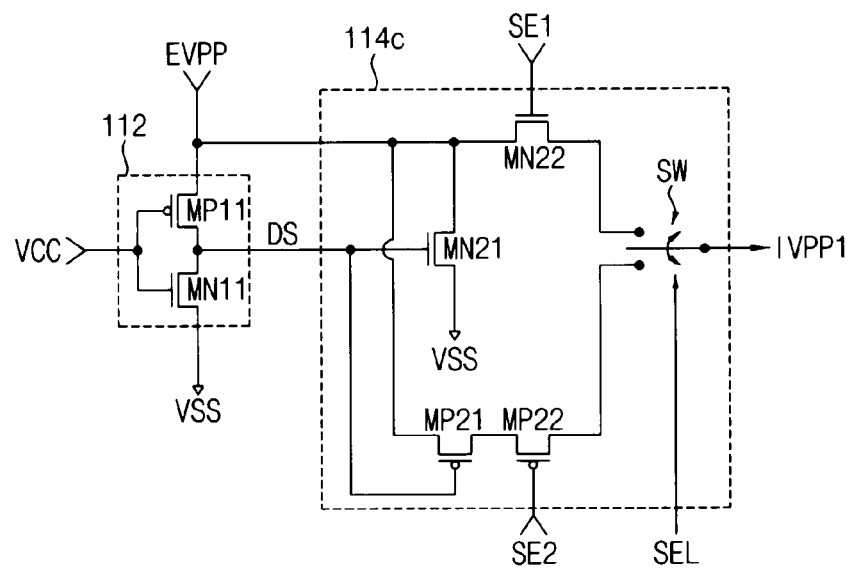
FIG. 7 is a circuit diagram illustrating still another example of the voltage supply controller included in the nonvolatile memory device of FIG. 1.

FIG. 7 is a circuit diagram illustrating still another example of the voltage supply controller included in the nonvolatile memory device of FIG. 1.

Referring to FIG. 7, a voltage supply controller 110c comprises a detection unit 112 and a control unit 114c. The detection unit 112 in FIG. 7 may be substantially the same as the detection unit 112 in FIG. 3.

The control unit 114c may output the external high voltage EVPP as the first internal voltage IVPP1 in response to the detection signal DS when the power supply voltage VCC has the normal level. The control unit 114c may selectively perform one of a first operation and a second operation in response to the detection signal DS and a selection signal SEL when the power supply voltage has the abnormal level. The first operation may indicate the interrupting the output of the external high voltage EVPP, as described above with reference to FIGS. 3 and 4. The second operation may indicate the reducing the level of the external high voltage EVPP and the outputting the reduced external high voltage as the first internal voltage IVPP1, as described above with reference to FIGS. 5 and 6. The control unit 114c may include a second NMOS transistor MN21, a third NMOS transistor MN22, a second PMOS transistor MP21, a third PMOS transistor MP22 and a switch SW.

The second NMOS transistor MN21 may have a first electrode receiving the external high voltage EVPP, a control electrode receiving the detection signal DS, and a second electrode receiving the ground voltage VSS. The third NMOS transistor MN22 may have a first electrode connected to the first electrode of the second NMOS transistor MN21, a control electrode receiving a first switch enable signal SE1, and a second electrode. The second PMOS transistor MP21 may have a first electrode receiving the external high voltage EVPP, a control electrode receiving the detection signal DS, and a second electrode. The third PMOS transistor MP22 may have a first electrode connected to the second electrode of the second PMOS transistor MP21, a control electrode receiving a second switch enable signal SE2, and a second electrode. The switch SW may selectively connect one of the second electrode of the third NMOS transistor MN22 and the second electrode of the third PMOS transistor MP22 to an output terminal of the first internal voltage IVPP1 in response to the selection signal SEL. The first switch enable signal SE1, the second switch enable signal SE2 and the selection signal SEL may be generated by the control circuit 170 in FIG. 1.

The control unit 114c in FIG. 7 may be implemented with a combination of the control unit 114a in FIG. 3 and the control unit 114b in FIG. 5. The control unit 114c in FIG. 7 may operate similarly to as illustrated in FIG. 4 or as illustrated in FIG. 6. Although not illustrated in FIG. 7, the control unit may be implemented without the switch SW. In that case, the selection signal SEL may be applied to both the control electrode of the third NMOS transistor MN22 and the control electrode of the third PMOS transistor MP22.

Figure 8:
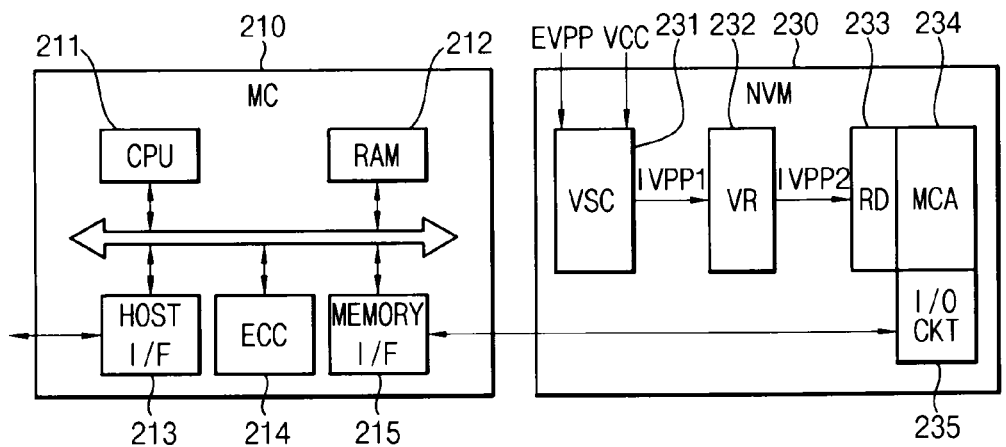
FIG. 8 is a block diagram illustrating a memory system according to an embodiment of the inventive concept.

FIG. 8 is a block diagram illustrating a memory system according to certain embodiments of the inventive concept.

Referring to FIG. 8, a memory system 200 generally comprises a memory controller 210 and a nonvolatile memory device 230.

The nonvolatile memory device 230 may be the nonvolatile memory device 100 of FIG. 1. The nonvolatile memory device 230 includes a voltage supply controller 231, a voltage regulator 232, a row decoder 233, a memory cell array 234 and an I/O circuit 235. The memory cell array 234 includes a plurality of memory cells. Each memory cell is connected to a respective one of a plurality of wordlines and a respective one of a plurality of bitlines. The voltage supply controller 231 generates a detection signal by detecting a level of a power supply voltage VCC, and generates a first internal voltage IVPP1 based on the detection signal and an external high voltage EVPP. The first internal voltage IVPP1 is changed depending on whether the power supply voltage VCC is normally supplied to the nonvolatile memory device 230 and/or the memory system 200. The voltage regulator 232 generates a plurality of second internal voltages IVPP2 based on the first internal voltage IVPP1. The row decoder 233 provides the plurality of second internal voltages IVPP2 to the plurality of wordlines. The I/O circuit 235 is connected to the plurality of bitlines, and stores data to be written in the memory cell array 234 or data read out from the memory cell array 234.

The memory controller 210 controls the nonvolatile memory device 230. The memory controller 210 may control data transfer between an external host (not illustrated) and the nonvolatile memory device 230. The memory controller 210 may include a central processing unit 211, a buffer memory 212, a host interface 213 and a memory interface 214. The central processing unit 211 may perform operations for the data transfer. The buffer memory 212 may be implemented by a dynamic random access memory (DRAM), a static random access memory (SRAM), a PRAM, a FRAM, a RRAM, a MRAM, etc. According to example embodiments, the buffer memory 212 may be located inside or outside the memory controller 210.

The host interface 213 may be coupled to the host, and the memory interface 214 may be coupled to the nonvolatile memory device 230. The central processing unit 211 may communicate with the host via the host interface 213. For example, the host interface 213 may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, the central processing unit 211 may communicate with the nonvolatile memory device 230 via the memory interface 214. In some example embodiments, the memory controller 210 may further include an error correction block 215 for error correction. According to example embodiments, the memory controller 210 may be built in the nonvolatile memory device 230, or the memory controller 210 and the nonvolatile memory device 230 may be implemented as separate chips.

The memory system 200 may be implemented as a memory card, a solid state drive, etc. In some example embodiments, the nonvolatile memory device 230, the memory controller 210 and/or the memory system 200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 9:
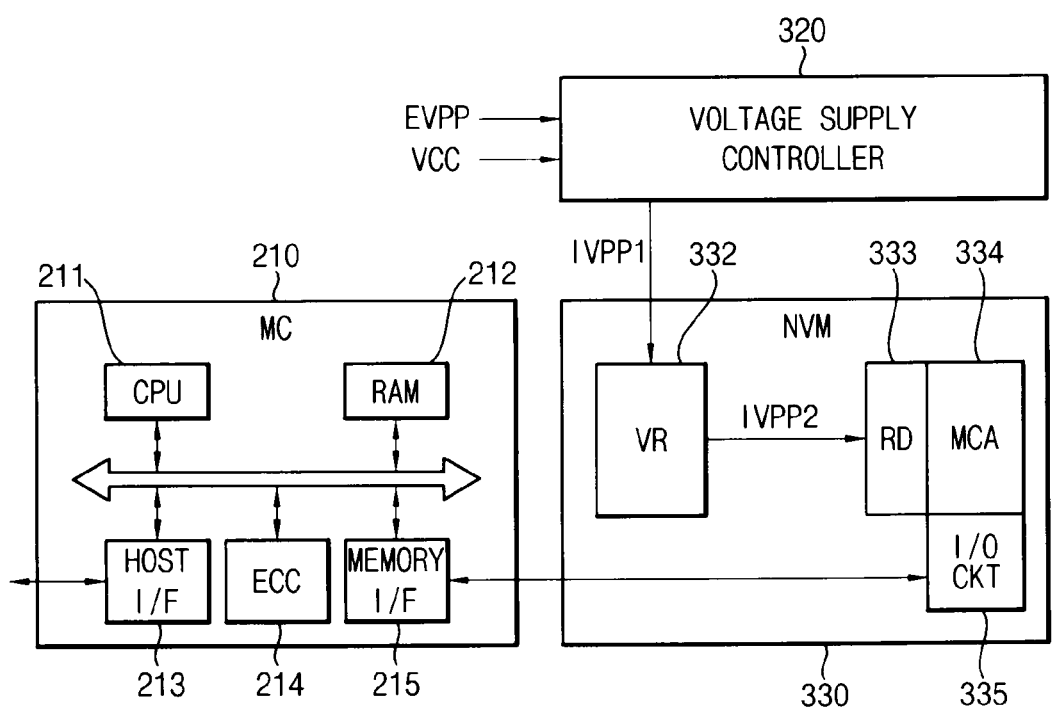
FIG. 9 is a block diagram illustrating a memory system according to another embodiment of the inventive concept.

FIG. 9 is a block diagram illustrating a memory system according to another embodiment of the inventive concept.

Referring to FIG. 9, a memory system 300 includes a memory controller 210, a voltage supply controller 320 and a nonvolatile memory device 330.

In comparison with the memory system 200 of FIG. 8, the memory system 300 may include the voltage supply controller 320 that is located outside the nonvolatile memory device 330.

The voltage supply controller 320 may be one of the voltage supply controller 110a of FIG. 3, the voltage supply controller 110b of FIG. 5, and the voltage supply controller 110c of FIG. 7. The voltage supply controller 320 generates a detection signal by detecting a level of a power supply voltage VCC, and generates a first internal voltage IVPP1 based on the detection signal and an external high voltage EVPP. The first internal voltage IVPP1 is changed depending on whether the power supply voltage VCC is normally supplied to the nonvolatile memory device 330 and/or the memory system 300.

The nonvolatile memory device 330 includes a plurality of memory cells. Each memory cell is connected to a respective one of a plurality of wordlines and a respective one of a plurality of bitlines. The nonvolatile memory device 330 generates a plurality of second internal voltages IVPP2 based on the first internal voltage IVPP1, and provides the plurality of second internal voltages IVPP2 to the plurality of wordlines. The nonvolatile memory device 330 may include a voltage regulator 332, a row decoder 333, a memory cell array 334 and an I/O circuit 335. The voltage regulator 332, the row decoder 333, the memory cell array 334 and the I/O circuit 335 in FIG. 9 may be substantially the same as the voltage regulator 232, the row decoder 233, the memory cell array 234 and the I/O circuit 235 in FIG. 8, respectively.

The memory controller 210 controls the nonvolatile memory device 330. The memory controller 210 may include a central processing unit 211, a buffer memory 212, a host interface 213, a memory interface 214 and an error correction block 215. The central processing unit 211, the buffer memory 212, the host interface 213, the memory interface 214 and the error correction block 215 in FIG. 9 may be substantially the same as the central processing unit 211, the buffer memory 212, the host interface 213, the memory interface 214 and the error correction block 215 in FIG. 8, respectively. In some example embodiments, the memory controller 210 may further control the voltage supply controller 320.

The voltage supply controllers 231 and 320 may interrupt an output of the external high voltage EVPP, or may reduce the level of the external high voltage EVPP and output the reduced external high voltage as the first internal voltage IVPP1 when the power supply voltage VCC is not supplied or abnormally supplied due to a power fluctuation or a blackout. The voltage supply controllers 231 and 320 may prevent damage to transistors included in the nonvolatile memory devices 230 and 330, may reduce the current consumption of the nonvolatile memory devices 230 and 330. Accordingly, the nonvolatile memory devices 230 and 330 may effectively and stably perform the program operation and/or the erase operation based on the external high voltage EVPP, and the memory systems 200 and 300 may have a relatively improved performance with a relatively reduced current consumption.

Figure 10:
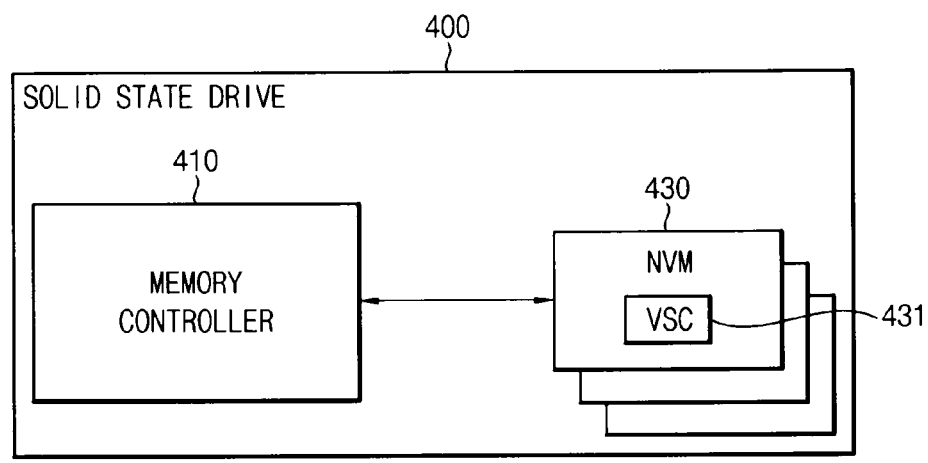
FIG. 10 is a block diagram illustrating a solid state drive including the memory system of FIG. 8.

FIG. 10 is a block diagram illustrating a solid state drive including the memory system of FIG. 8.

Referring to FIG. 10, a solid state drive (SSD) 400 comprises a memory controller 410 and a plurality of nonvolatile memory devices 430.

The memory controller 410 may receive data from a host (not illustrated). The memory controller 410 may store the received data in the plurality of nonvolatile memory devices 430.

The plurality of nonvolatile memory devices 430 may include a plurality of memory cells (not illustrated) and a voltage supply controller 431. The voltage supply controller 431 may interrupt an output of an external high voltage, or may reduce a level of the external high voltage and output the reduced external high voltage as a first internal voltage when the power supply voltage is not supplied or abnormally supplied. The voltage supply controller 431 may prevent damage to transistors included in the nonvolatile memory devices 430, may reduce the current consumption of the nonvolatile memory devices 430, and may improve a performance of the nonvolatile memory devices 430. The nonvolatile memory devices 430 may effectively and stably perform the program operation and/or the erase operation based on the external high voltage.

In some example embodiments, the solid state drive 400 may be coupled to the host, such as a mobile device, a mobile phone, a smart phone, a personal digital assistant (PDA), a portable multimedia player (PMP), a digital camera, a portable game console, a music player, a desktop computer, a notebook computer, a tablet computer, a speaker, a video, a digital television, etc.

Figure 11:
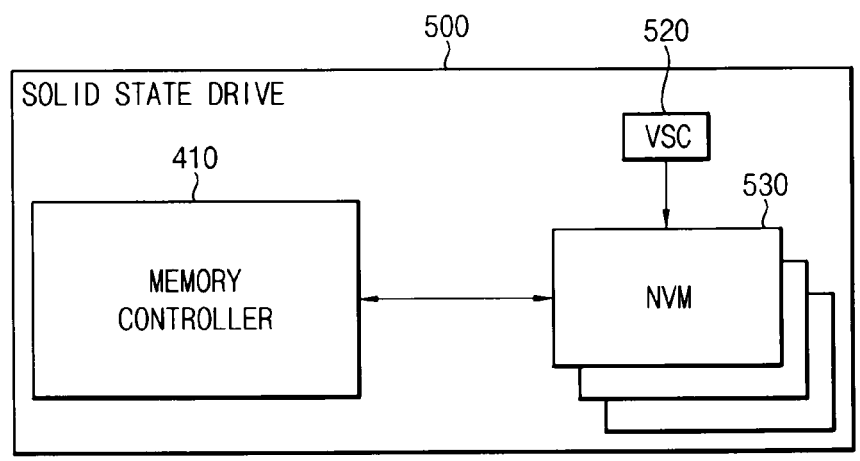
FIG. 11 is a block diagram illustrating a solid state drive including the memory system of FIG. 9.

FIG. 11 is a block diagram illustrating a solid state drive including the memory system of FIG. 9.

Referring to FIG. 11, a SSD 500 comprises a memory controller 410, a voltage supply controller 520 and a plurality of nonvolatile memory devices 530.

The memory controller 410 in FIG. 11 may be substantially the same as the memory controller 410 in FIG. 10. The voltage supply controller 520 may interrupt an output of an external high voltage, or may reduce a level of the external high voltage and output the reduced external high voltage as a first internal voltage when the power supply voltage is not supplied or abnormally supplied. The voltage supply controller 520 may be used to prevent damage to transistors included in the nonvolatile memory devices 530, reduce the current consumption of the nonvolatile memory devices 530, and improve a performance of the nonvolatile memory devices 530. The nonvolatile memory devices 530 may include a plurality of memory cells (not illustrated), and may effectively and stably perform the program operation and/or the erase operation based on the external high voltage.

Figure 12:
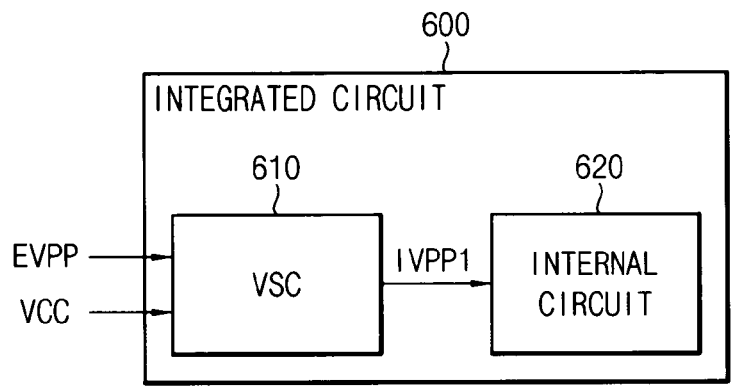
FIG. 12 is a block diagram illustrating an integrated circuit including a voltage supply controller according to an embodiment of the inventive concept.

FIG. 12 is a block diagram illustrating an integrated circuit including a voltage supply controller according to certain embodiments of the inventive concept.

Referring to FIG. 12, an integrated circuit 600 generally comprises a voltage supply controller 610 and an internal circuit 620. According to example embodiments, the integrated circuit 600 may be an application processor (AP), a microprocessor, a central processing unit (CPU), an application-specific integrated circuit (ASIC), a mobile system-on-chip (SOC), a multimedia SOC, a smart card, or the like.

The voltage supply controller 610 may interrupt an output of an external high voltage, or may reduce a level of the external high voltage and output the reduced external high voltage as a first internal voltage IVPP1 when the power supply voltage is not supplied or abnormally supplied. The voltage supply controller 610 may prevent damage to transistors included in the internal circuit 620, may reduce the current consumption of the internal circuit 620, and may improve a performance of the internal circuit 620. The internal circuit 620 may perform various operations based on the first internal voltage IVPP1.

Figure 13:
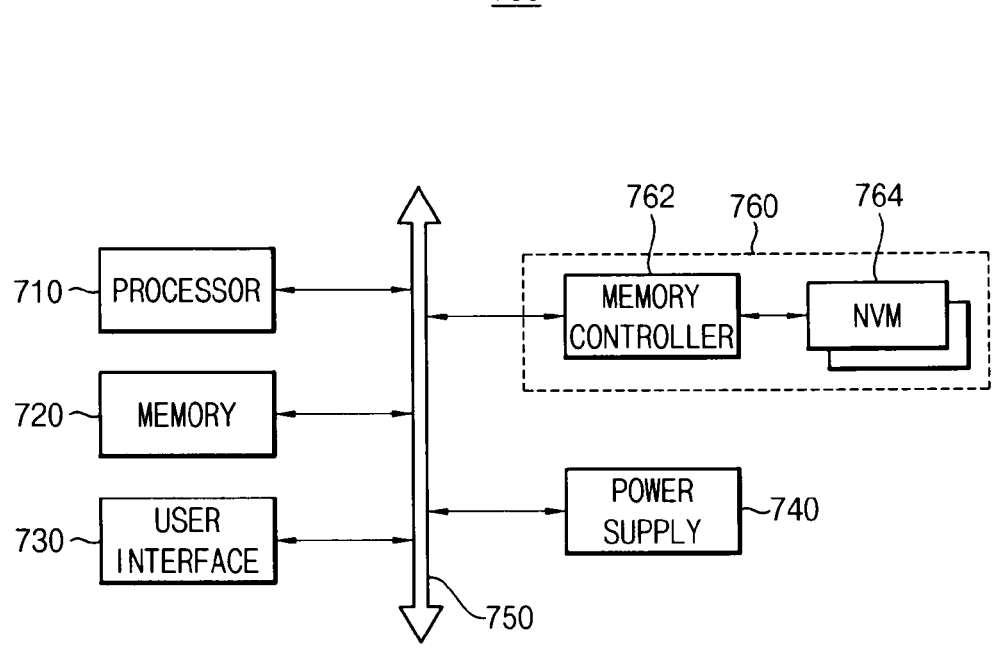
FIG. 13 is a diagram illustrating a computational system according to an embodiment of the inventive concept.

FIG. 13 is a diagram illustrating a computational system according to an embodiment of the inventive concept.

Referring to FIG. 13, a computational system 700 includes a processor 710, a memory device 720, a user interface 730 and a memory system 760. In some example embodiments, the computing system 700 may further include a power supply 740 that provides a power supply voltage and/or an external high voltage, and may further include a baseband chipset, an application chipset, a camera image processor (CIS), etc.

The processor 710 may perform specific calculations or tasks. For example, the processor 710 may be a microprocessor, a central processing unit (CPU), a digital signal processor, or the like. The processor 710 may be coupled to the memory device 720 via a bus 750, such as an address bus, a control bus and/or a data bus. For example, the memory device 720 may be implemented by a DRAM, a mobile DRAM, a SRAM, a PRAM, a FRAM, a RRAM, a MRAM and/or a flash memory. Further, the processor 710 may be coupled to an extension bus, such as a peripheral component interconnect (PCI) bus, and may control the user interface 730 including at least one input device, such as a keyboard, a mouse, a touch screen, etc., and at least one output device, a printer, a display device, etc.

The memory system 760 may be one of the memory system 200 of FIG. 8 and the memory system 300 of FIG. 9, and may include a memory controller 762 and a nonvolatile memory device 764. The nonvolatile memory device 764 may be controlled by the memory controller 762 to store data processed by the processor 710. The memory system 760 may include a voltage supply controller that is located inside or outside the nonvolatile memory device 764. The voltage supply controller may prevent damage to transistors included in the nonvolatile memory device 764, and thus the memory system 760 may have a relatively improved performance with a relatively reduced current consumption.

The above described embodiments may be used in any device or system including a nonvolatile memory device, such as a mobile phone, a smart phone, a PDA, a PMP, a digital camera, a digital television, a set-top box, a music player, a portable game console, a navigation device, a personal computer (PC), a server computer, a workstation, a tablet computer, a laptop computer, a smart card, a printer, etc.

The foregoing examples are illustrative embodiments and the inventive concept is not limited to only these examples. Those skilled in the art will readily appreciate that many modifications are possible in the example embodiments without materially departing from the novel teachings and advantages of the inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device, comprising:
    a voltage supply controller receiving a power supply voltage and an external high voltage having a level higher than the power supply voltage and configured to generate a detection signal by detecting a level of the power supply voltage and generate a first internal voltage in response to the detection signal and the external high voltage, wherein a level of the first internal voltage varies with the detection signal;
    a voltage regulator receiving the first internal voltage and configured to generate second internal voltages in response to the first internal voltage;
    a row decoder configured to selectively provide the second internal voltages to a plurality of word lines;
    a memory cell array including a plurality of nonvolatile memory cells, each nonvolatile memory cell being connected to a respective one of the plurality of word lines and a respective one of a plurality of bitlines; and
    a charge pump receiving the power supply voltage and configured to generate a third internal voltage by performing a charge pumping operation on the power supply voltage,
    wherein the voltage regulator is configured to select as a selected internal voltage one of the first internal voltage and the third internal voltage in response to a mode selection signal, and generate the second internal voltages in response to the selected internal voltage.

2. The nonvolatile memory device of claim 1, wherein the voltage supply controller generates the first internal voltage at a first level substantially the same as the level of the external high voltage when the power supply voltage is normally supplied, and generates the first internal voltage at a second level lower than the first level when the power supply voltage is abnormally supplied.

3. The nonvolatile memory device of claim 2, wherein the voltage supply controller comprises:
    a detection unit receiving the power supply voltage and the external high voltage and configured to generate the detection signal by detecting a level of the power supply voltage in relation to the external high voltage and a ground voltage; and
    a control unit receiving the detection signal and configured to provide the external high voltage as the first internal voltage in response to the detection signal when the power supply voltage is normally supplied, and interrupt output of the external high voltage in response to the detection signal when the power supply voltage is abnormally supplied.

4. The nonvolatile memory device of claim 3, wherein the detection unit comprises:
    a first P-type metal oxide semiconductor (PMOS) transistor having a first electrode receiving the external high voltage, a control electrode receiving the power supply voltage, and a second electrode providing the detection signal; and
    a first N-type metal oxide semiconductor (NMOS) transistor having a first electrode connected to the second electrode of the first PMOS transistor, a control electrode receiving the power supply voltage, and a second electrode receiving the ground voltage.

5. The nonvolatile memory device of claim 4, wherein the control unit comprises:
    a second PMOS transistor having a first electrode receiving the external high voltage, a control electrode receiving the detection signal, and a second electrode; and
    a third PMOS transistor having a first electrode connected to the second electrode of the second PMOS transistor, a control electrode receiving a switch enable signal, and a second electrode outputting the first internal voltage.

6. The nonvolatile memory device of claim 3, wherein the second level is substantially equal to the ground voltage.

7. The nonvolatile memory device of claim 2, wherein the voltage supply controller comprises:
    a detection unit receiving the power supply voltage and the external high voltage and configured to generate the detection signal by detecting a level of the power supply voltage relative to the external high voltage and a ground voltage; and
    a control unit configured to output the external high voltage as the first internal voltage in response to the detection signal when the power supply voltage is normally supplied, and to output at a reduce level the external high voltage in response to the detection signal when the power supply voltage is abnormally supplied.

8. The nonvolatile memory device of claim 7, wherein the detection unit comprises:
    a first P-type metal oxide semiconductor (PMOS) transistor having a first electrode receiving the external high voltage, a control electrode receiving the power supply voltage, and a second electrode outputting the detection signal; and
    a first N-type metal oxide semiconductor (NMOS) transistor having a first electrode connected to the second electrode of the first PMOS transistor, a control electrode receiving the power supply voltage, and a second electrode receiving the ground voltage.

9. The nonvolatile memory device of claim 8, wherein the control unit comprises:
    a second NMOS transistor having a first electrode receiving the external high voltage, a control electrode receiving the detection signal, and a second electrode receiving the ground voltage; and
    a third NMOS transistor having a first electrode connected to the first electrode of the second NMOS transistor, a control electrode receiving a switch enable signal, and a second electrode outputting the first internal voltage.

10. The nonvolatile memory device of claim 2, wherein the voltage supply controller comprises:
a detection unit receiving the power supply voltage and the external high voltage and configured to generate the detection signal by detecting a level of the power supply voltage in relation to the external high voltage and a ground voltage; and
a control unit receiving a selection signal, the detection signal, and the external high voltage and configured to output the external high voltage as the first internal voltage in response to the detection signal when the power supply voltage is normally supplied, and further configured to either interrupt output of the external high voltage as the first internal voltage in response to the detection signal and the selection signal when the power supply voltage is abnormally supplied, or reduce the level of the external high voltage and output a reduced level external high voltage as the first internal voltage in response to the detection signal and the selection signal when the power supply voltage is abnormally supplied.

11. The nonvolatile memory device of claim 1, further comprising:
an input/output (I/O) circuit connected to the plurality of bitlines, and configured to store data to be written in the memory cell array and data read retrieved from the memory cell array; and
a control circuit configured to control operation of the voltage supply controller, the voltage regulator, the row decoder, and the I/O circuit.

12. The nonvolatile memory device of claim 1, wherein the plurality of memory cells includes at least one of single-level memory cells (SLC) and multi-level memory cells (MLC).

13. A memory system, comprising:
a memory controller configured to control operation of a nonvolatile memory device, wherein the nonvolatile memory device comprises:
a voltage supply controller receiving a power supply voltage and an external high voltage having a level higher than the power supply voltage and configured to generate a detection signal by detecting a level of the power supply voltage and generate a first internal voltage in response to the detection signal and the external high voltage, wherein a level of the first internal voltage varies with the detection signal;
a voltage regulator receiving the first internal voltage and configured to generate second internal voltages in response to the first internal voltage;
a row decoder configured to selectively provide the second internal voltages to a plurality of word lines;
a memory cell array including a plurality of nonvolatile memory cells, each nonvolatile memory cell being connected to a respective one of the plurality of word lines and a respective one of a plurality of bitlines; and
a charge pump receiving the power supply voltage and configured to generate a third internal voltage by performing a charge pumping operation on the power supply voltage,
wherein the voltage regulator is configured to select as a selected internal voltage one of the first internal voltage and the third internal voltage in response to a mode selection signal, and generate the second internal voltages in response to the selected internal voltage.

14. The memory system of claim 13, wherein the voltage supply controller generates the first internal voltage at a first level substantially the same as the level of the external high voltage when the power supply voltage is normally supplied, and generates the first internal voltage at a second level lower than the first level when the power supply voltage is abnormally supplied.

15. The memory system of claim 14, wherein the voltage supply controller comprises:
a detection unit receiving the power supply voltage and the external high voltage and configured to generate the detection signal by detecting a level of the power supply voltage in relation to the external high voltage and a ground voltage; and
a control unit receiving the detection signal and configured to provide the external high voltage as the first internal voltage in response to the detection signal when the power supply voltage is normally supplied, and interrupt output of the external high voltage in response to the detection signal when the power supply voltage is abnormally supplied.

16. The memory system of claim 14, wherein the voltage supply controller comprises:
a detection unit receiving the power supply voltage and the external high voltage and configured to generate the detection signal by detecting a level of the power supply voltage relative to the external high voltage and a ground voltage; and
a control unit configured to output the external high voltage as the first internal voltage in response to the detection signal when the power supply voltage is normally supplied, and to output at a reduce level the external high voltage in response to the detection signal when the power supply voltage is abnormally supplied.

17. The memory system of claim 14, wherein the voltage supply controller comprises:
a detection unit receiving the power supply voltage and the external high voltage and configured to generate the detection signal by detecting a level of the power supply voltage in relation to the external high voltage and a ground voltage; and
a control unit receiving a selection signal, the detection signal, and the external high voltage and configured to output the external high voltage as the first internal voltage in response to the detection signal when the power supply voltage is normally supplied, and further configured to either interrupt output of the external high voltage as the first internal voltage in response to the detection signal and the selection signal when the power supply voltage is abnormally supplied, or reduce the level of the external high voltage and output a reduced level external high voltage as the first internal voltage in response to the detection signal and the selection signal when the power supply voltage is abnormally supplied.

18. A flash memory device, comprising:
a plurality of flash memory cells arranged in a memory cell array including a plurality of word lines and a plurality of bitlines;
a row decoder that selectively provide at least one of a plurality control signals to each one of the plurality of word lines, wherein the plurality of control signals are respectively derived from an internal voltage;
a voltage regulator receiving a first internal voltage and configured to generate the internal voltage in response to the first internal voltage;
a voltage supply controller receiving a power supply voltage and an external high voltage having an activated level higher than an activated level of the power supply voltage and configured to generate a detection signal by detecting a level of the power supply voltage and generate the first internal voltage in response to the detection signal and the external high voltage, wherein a level of the first internal voltage is equal to the activated level of the external high voltage when the power supply voltage is normally supplied, and the level of the first internal voltage is lower than the activated level of the external high voltage when the power supply voltage is abnormally supplied; and a charge pump receiving the power supply voltage and configured to generate a third internal voltage by performing a charge pumping operation on the power supply voltage, wherein the voltage regulator is configured to select as a selected internal voltage one of the first internal voltage and the third internal voltage in response to a mode selection signal, and generate the second internal voltages in response to the selected internal voltage.

19. The flash memory device of claim 18, wherein the plurality of flash memory cells includes multi-level memory cells (MLC).

* * * * *